(12) United States Patent
Onozawa et al.

(10) Patent No.: US 7,586,530 B2
(45) Date of Patent: Sep. 8, 2009

(54) SOLID-STATE IMAGING DEVICE INCLUDING PIXELS ARRANGED IN A TWO-DIMENSIONAL ARRAY

(75) Inventors: Kazutoshi Onozawa, Takatsuki (JP); Daisuke Ueda, Ibaraki (JP); Shinji Yoshida, Takatsuki (JP)

(73) Assignee: Panasonic Corporation, Osaka (JP)

( * ) Notice: Subject to any disclaimer, the term of this patent is extended or adjusted under 35 U.S.C. 154(b) by 620 days.

(21) Appl. No.: 11/234,258

(22) Filed: Sep. 26, 2005

(65) Prior Publication Data

US 2006/0066743 A1  Mar. 30, 2006

(30) Foreign Application Priority Data

Sep. 29, 2004  (JP) .............................. 2004-283820

(51) Int. Cl.
*H04N 3/14* (2006.01)
*H04N 5/335* (2006.01)
(52) U.S. Cl. ....................................... 348/294; 348/273
(58) Field of Classification Search ....................... None
See application file for complete search history.

(56) References Cited

U.S. PATENT DOCUMENTS

| 6,052,238 | A | 4/2000 | Ebbesen et al. | |
|---|---|---|---|---|
| 6,236,033 | B1 * | 5/2001 | Ebbesen et al. | ............. 250/216 |
| 7,149,395 | B1 * | 12/2006 | Chen et al. | ................... 385/128 |
| 7,248,297 | B2 * | 7/2007 | Catrysse et al. | ............. 348/273 |
| 7,315,426 | B2 * | 1/2008 | Kim et al. | .................... 359/738 |

FOREIGN PATENT DOCUMENTS

| JP | 5-251673 | 9/1993 |
|---|---|---|
| JP | 11-072607 | 3/1999 |
| JP | 3008931 | 12/1999 |
| JP | 2004-070288 | 3/2004 |

\* cited by examiner

*Primary Examiner*—Justin P Misleh
(74) *Attorney, Agent, or Firm*—Wenderoth, Lind & Ponack, L.L.P.

(57) ABSTRACT

The present invention provides a solid-state imaging device including an optical element that efficiently condenses even wide-angle incident light and has a color separation function. The solid-state imaging device includes pixels, and in the device each pixel includes: a light receiving element; and an optical element, whose surface, at least, is made of metal, the optical element has: an aperture; and convex parts which are arranged cyclically, and a distance between adjacent convex parts and a width of each convex part range from 0 to 1 wavelength of the light to be condensed.

13 Claims, 10 Drawing Sheets

FIG. 2
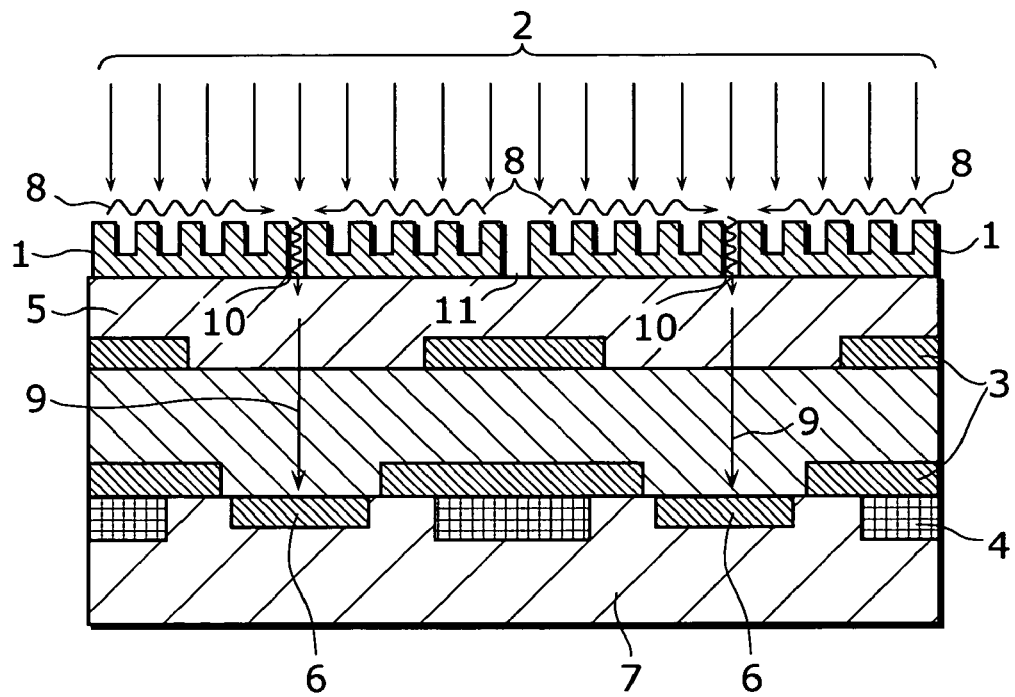
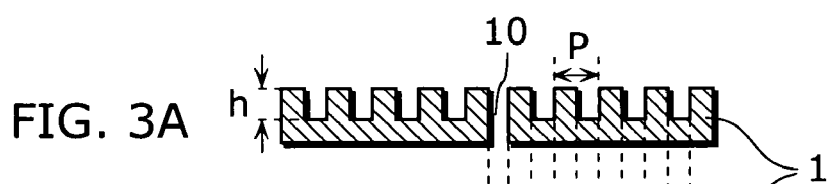
FIG. 3A
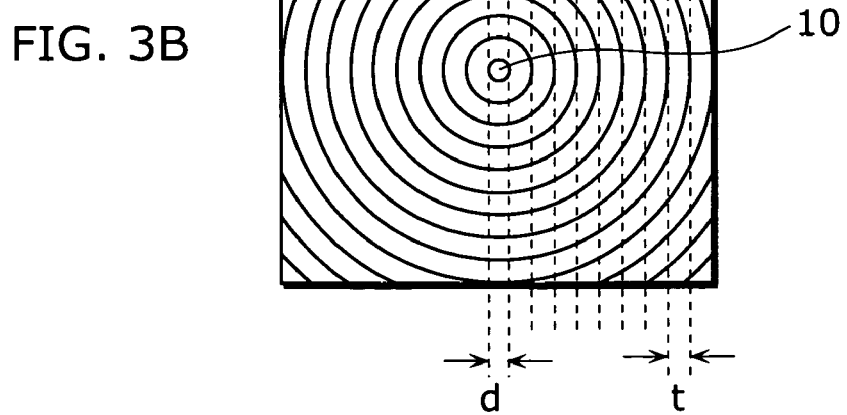
FIG. 3B

FIG. 6
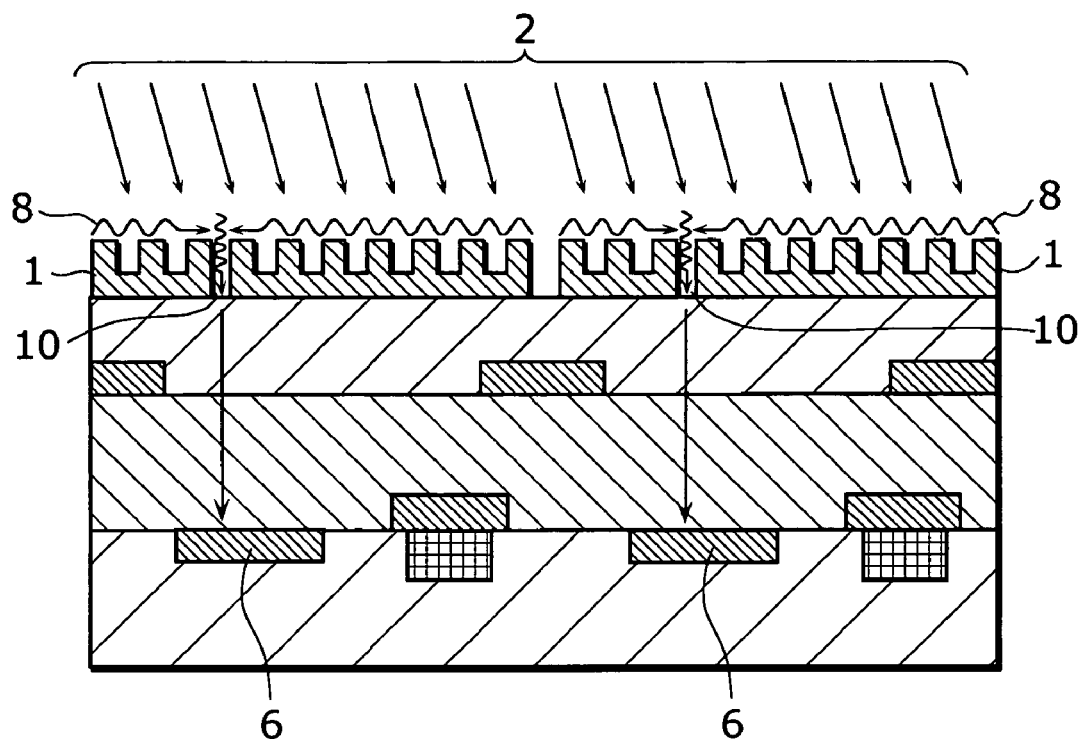
FIG. 7A
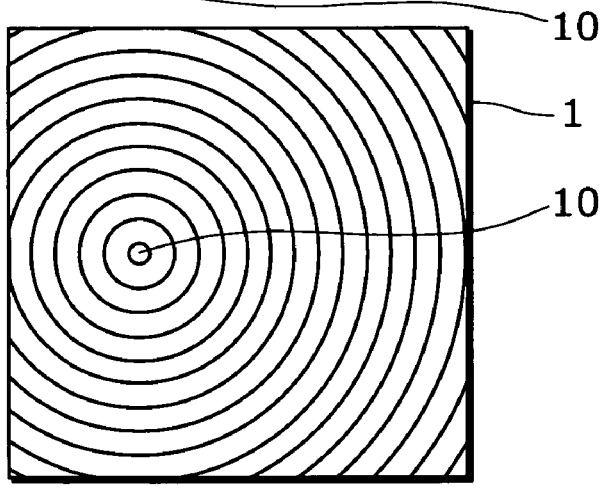
FIG. 7B

SOLID-STATE IMAGING DEVICE INCLUDING PIXELS ARRANGED IN A TWO-DIMENSIONAL ARRAY

BACKGROUND OF THE INVENTION (1) Field of the Invention

The present invention relates to solid-state imaging devices used for digital still cameras and the like.

(2) Description of the Related Art

With widespread use of digital cameras and mobile phones with a camera, the market of solid-state imaging devices has been growing. Thus demands for solid-state imaging devices are not limited to the realization of high sensitivity and an increase in the number of pixels. There is a strong demand for realizing a slim camera to be mounted on a slim apparatus, and thus such a solid-state imaging device is required to receive wide-angle incident light. This means that the demand is to receive both wide angle incident light and perpendicular incident light, even though the focus distance of a lens is short.

At present, in a CCD or a MOS image sensor that is widely used as a solid-state imaging device, semiconductor integrated circuits, each of which includes a light receiving element, are arranged in a two-dimensional array. Each light receiving element converts a light signal from an object into an electric signal. The sensitivity of a solid-state imaging device is defined by the magnitude of output currents from the light receiving elements in proportion to the amount of incident light. Therefore, for the reception of wide-angle incident light, there is a need to guide the light coming from the wide-angle direction to these light receiving elements.

There is also strong demand for realizing low cost solid-state imaging devices. This is because such devices are main components of digital still cameras that are in a fierce price competition. Therefore, such CCD and MOS image sensors are also being increasingly downsized. As a result of the downsizing of such image sensors and the increase in the number of pixels, the size of a light receiving area per pixel is being reduced. Therefore, a technique of condensing light to light receiving elements is of importance.

FIG. 1 shows a cross-sectional view of a conventional solid-state imaging device. A light 102 (the light shown by a solid line) that perpendicularly enters a microlens 101 proceeds to a color filter 108. The color filter 108 allows the color component, included in the incident light 102, which corresponds to the color filter 108 to pass through. The light that passed through the color filter 108 is converted into an electric signal by a light receiving element 106. Since a comparatively high light condensing efficiency can be obtained, the microlens 101 is used in almost all the solid-state imaging devices. Note that such a structure of a solid-state imaging device is also disclosed in, for example, Japanese Laid-open Patent Application No. 5-251673 publication.

As described above, a solid-state imaging device that receives a wide-angle incident light is required to guide the wide angle incident light to light receiving elements.

However, in the case of using a microlens 101, the light condensing efficiency decreases as the incidence angle of a signal light is increased. In other words, as shown in FIG. 1, the light condensing efficiency is high in the case of an incident light 102 perpendicular to the microlens 101, but the light condensing efficiency is low in the case of an oblique incident light 112 (the light shown by a 1-margin line). The reason is as follows. Since the oblique incident light 112 is partly blocked by a metal wire 103 in pixels or is widely deflected by the microlens 101, a part of the oblique light 112 does not reach the light receiving elements 106.

A solid-state imaging device is composed of pixels that are arranged in a two-dimensional array. Therefore, in the case of wide angle incident light, the angle of light incidence to the pixels in the peripheral part is greater than the angle of light incidence to the pixels in the center part. In other words, the oblique incident light 112 enters the pixels in the peripheral part. Therefore, the light condensing efficiency of the pixels in the peripheral part is lower than the light condensing efficiency of the pixels in the center part.

Further, even in the case of an incident light perpendicular to the microlens 101, as shown in FIG. 1, the incident light 122 (the light shown by a dotted line) to the boundaries of pixels cannot be condensed at a high efficiency. The reason is that a part of the light does not reach the light receiving elements 106 because it is blocked by the metal wire 103.

Also, almost all of the solid-state imaging devices have color filers 108 for red (R), for green (G) and for blue (B) that are used for separating incident light into color components of the light. This is the cause of increases in cost.

SUMMARY OF THE INVENTION

The present invention is conceived considering the above problems. An object of the present invention is to provide a solid-state imaging device including an optical element that efficiently condenses even wide-angle incident light and has a color separation function.

The solid-state imaging device, of the present invention, includes pixels which are arranged in a two dimensional array, and in the device each pixel includes: a light receiving element; and an optical element, whose surface at least, is made of metal, the optical element has: an aperture; and convex parts which are arranged cyclically, and the distance between adjacent convex parts and the width of each convex part range from 0 to 1 wavelength of light to be condensed, and the light receiving elements receive light from the aperture.

The use of the optical element enables efficient condensing of even wide-angle incident light and a color component, of the light, having the wavelength depending on a distance between adjacent convex parts and a width of each convex part.

Also, in a first aspect of the present invention, in the solid-state imaging device, each convex part is arranged cyclically like concentric circles. Also, in the first aspect of the present invention, in the solid-state imaging device, each convex part is arranged cyclically like similar polygons. Also, in one of the second and third aspects of the present invention, in the solid-state imaging device, the convex parts consist of pillar-shaped convexes.

Also, in the first aspect of the present invention, it is preferable that, in the solid-state imaging device, the distance between the adjacent convex parts and the width of each convex part correspond to the color of light to be condensed.

In this way, light can be separated into the respective color components of red (R), green (G) and blue (B).

Also, in the first aspect of the present invention, it is preferable that, in the solid-state imaging device, the distance between the adjacent convex parts and the width of each convex part correspond to an angle of incident light to be condensed.

This makes it possible to condense wide-angle incident light.

Also, in the first aspect of the present invention, in the device, the distance between the top surface of the light receiving element and the base surface of the optical element is not more than 3 wavelengths of the light that is to be condensed.

This makes it possible to guide light from the aperture to the light receiving elements.

Also, in the first aspect of the present invention, in the device, the height of each convex part ranges from 0 to not more than 1 wavelength of light to be condensed.

Also, in the first aspect of the present invention, in the device, adjacent optical elements are electrically isolated from each other.

This makes it possible to prevent the mixture of colors corresponding pixels and cross talk.

The present invention can provide a solid-state imaging device including an optical element that efficiently condenses even wide-angle incident light and has a color separation function.

The disclosure of Japanese Patent Application No. 2004-283820 filed on Sep. 29, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2 is a cross-sectional view of a solid-state imaging device of a first embodiment;

FIG. 3A is a cross-sectional view of an optical element 1 of the first embodiment;

FIG. 3B is a top view of the optical element 1 of the first embodiment;

FIG. 6 is a cross-sectional view of the solid-state imaging device of the first embodiment;

FIG. 7A is a cross-sectional view of the optical element 1 of the first embodiment;

FIG. 7B is a top view of the optical element 1 of the first embodiment;

DETAILED DESCRIPTION OF THE INVENTION

Best modes of the present invention will be described below with reference to figures.

First Embodiment

First, the solid-state imaging device in a first embodiment will be described.

Figure 1:
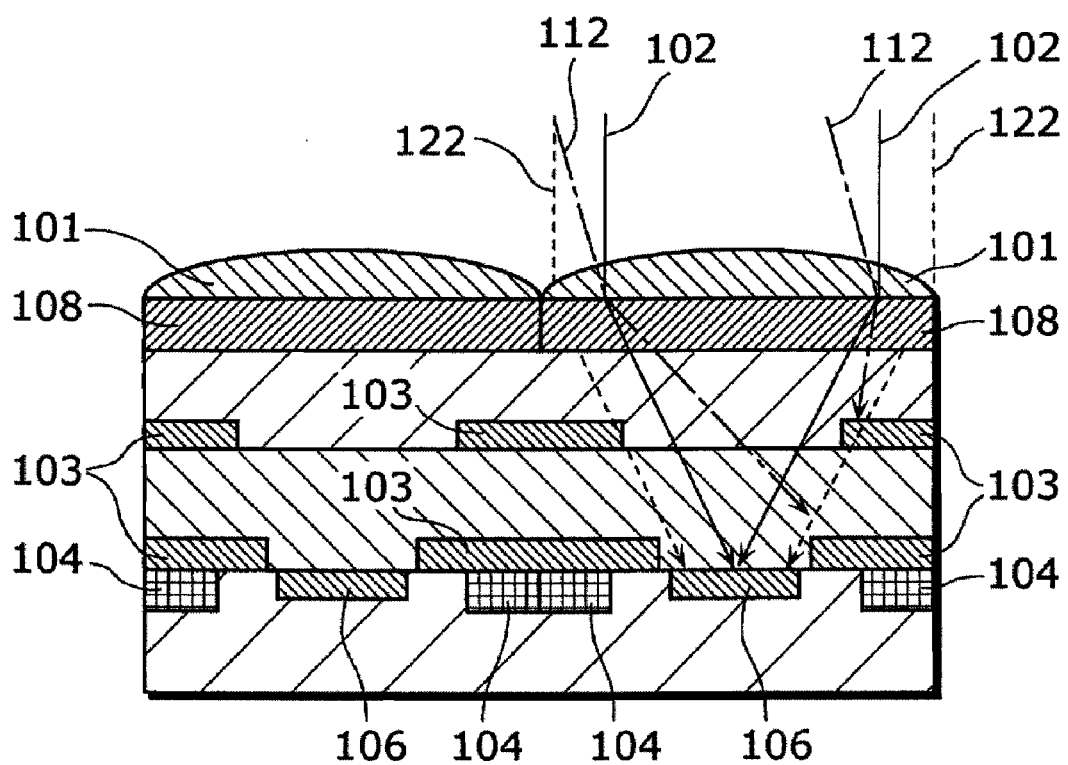
FIG. 1 is a cross-sectional view of a conventional solid-state imaging device.

FIG. 2 is a cross-sectional view of the solid-state imaging device of the first embodiment. As shown in FIG. 2, each pixel (which is a cube measuring 2.8 μm per side) includes: an optical element 1; a metal wire 3; a signal transmission unit 4; a planarization layer 5; a light receiving element (for example, a Si photodiode) 6; and a Si substrate 7. The solid-state imaging device of this embodiment differs from a conventional solid-state imaging device described with reference to FIG. 1 in that it has an optical element 1. Also, the solid-state imaging device of this embodiment differs in that it does not have a microlens 101 and color filters 108. The optical element 1 has a light condensing function and a light separation function.

The optical element 1 is made of metal such as gold, silver and aluminium. FIG. 3A is a cross-sectional view of the optical element 1, and FIG. 3B is a top view of the optical element 1. As shown in FIGS. 3A and 3B, the optical element 1 is made of metal and has a form including convex parts each of which is arranged cyclically like concentric circles (i.e., concentrically), which has an aperture 10 as a center. Difference t in radius between adjacent circles ranges from 20 to 400 nm. In other words, widths t of the respective convex parts and gaps t between adjacent convex parts range from 20 to 400 nm. Also, heights h of the convex parts range from 20 to 800 nm. Note that concentric convex parts are also called "pattern" hereinafter for convenience in explanation.

Also, the aperture 10 of the optical element 1 is a cylindrical aperture. The diameter d of the aperture 10 is the same as the difference t in radius. Also, as shown in FIG. 2, the gap 11 between adjacent optical elements is greater than the diameter d of the aperture 10.

FIG. 2 shows a schematic view of an incident light 2 having a wavelength λ. The incident light 2 enters each pixel almost perpendicularly and is condensed in the pixel. The straight arrow schematically shows the propagation and the propagation direction of an incident light 2, and the wave arrow schematically shows the propagation and the propagation direction of plasmons 8 on the surface of the optical element 1 that is made of metal. The plasmons 8 are collective oscillations of conduction electrons on the surface of the optical element 1. Note that the technique concerning plasmons on a metal surface is described in the following document: Giant optical transmission of sub-wavelength apertures: physics and applications: INSTITUTE OF PHYSICS PUBLISHING Nanotechnology 13 (2002) 429-432, Tineke Thio et. al.).

The incident light 2 couples to plasmons on the surface of the optical element 1, and the energy of the incident light 2 is converted into the energy of the plasmons 8 because of its cyclical structure patterns. The diameter d of the aperture 10 is the same as the difference t in radius. The gap 11 between adjacent optical elements is greater than the diameter d of the aperture 10. In this way, the plasmons 8 are condensed in the aperture 10 that is formed on the center of the pattern. After that the plasmons 8 pass through the aperture 10 and are transmitted to the back surface (the Si substrate 7 side) of the optical element 1. The plasmons 8 that are transmitted to the back surface are converted into light 9 and then the light 9 proceeds to light receiving elements 6 as irradiation light. In this way, the optical element 1 can condense all the incident light.

In the case where a cyclical structure pattern is not formed, only the incident light that enters the aperture 10 can reach the light receiving elements 6. However, with the cyclical structure pattern, light can couple to plasmons 8, and thus all the incident light can be condensed to all of the pixels. Since patterns are formed on the optical element 1, the amount of light irradiated from the aperture 10 exceeds 20 times the amount of the light that passes through the aperture 10 in the case where such patterns are not formed. When the difference t in radius is not more than 1 wavelength of the light to be condensed, the energy of the incident light 2 is converted into the energy of the plasmons 8 and its light condensing energy is at its maximum.

Also, with this excitation of the plasmons 8, a near field light (electromagnetic wave) is generated in the proximity of the surface of the optical element 1, but the intensity of the electromagnetic wave decreases as their generation point becomes increasingly distant from the surface, in the example case where the distance is equivalent to the wavelength of the light, the intensity decreases by half. Therefore, it is preferable that the heights of the convex parts be approximately equivalent to the wavelength of the light.

Also, forming an optical element 1 having a cyclical pattern in accordance with a color component of the light to be condensed enables guidance of only the color pixel to the corresponding light receiving element 6. More specifically, the wavelength of the light that couples to plasmons can be changed by the cyclical pitch p shown in FIG. 3 depending on the color component to be condensed, the cyclical pitch p being equivalent to twice the difference t in radius. In this way, light can be separated into respective colors for pixels. Here is an example case of an optical element 1 made of silver. To efficiently condense a red light (having a wavelength $\lambda$ of 0.65 $\mu$m), a pattern cyclical pitch p of 550 nm should be formed. To efficiently condense a green light (having a wavelength $\lambda$ of 0.55 $\mu$m), a pattern cyclical pitch p of 450 nm should be formed. To efficiently condense a blue light (having a wavelength $\lambda$ of 0.45 $\mu$m), a pattern cyclical pitch p of 300 nm should be formed.

Figure 4:
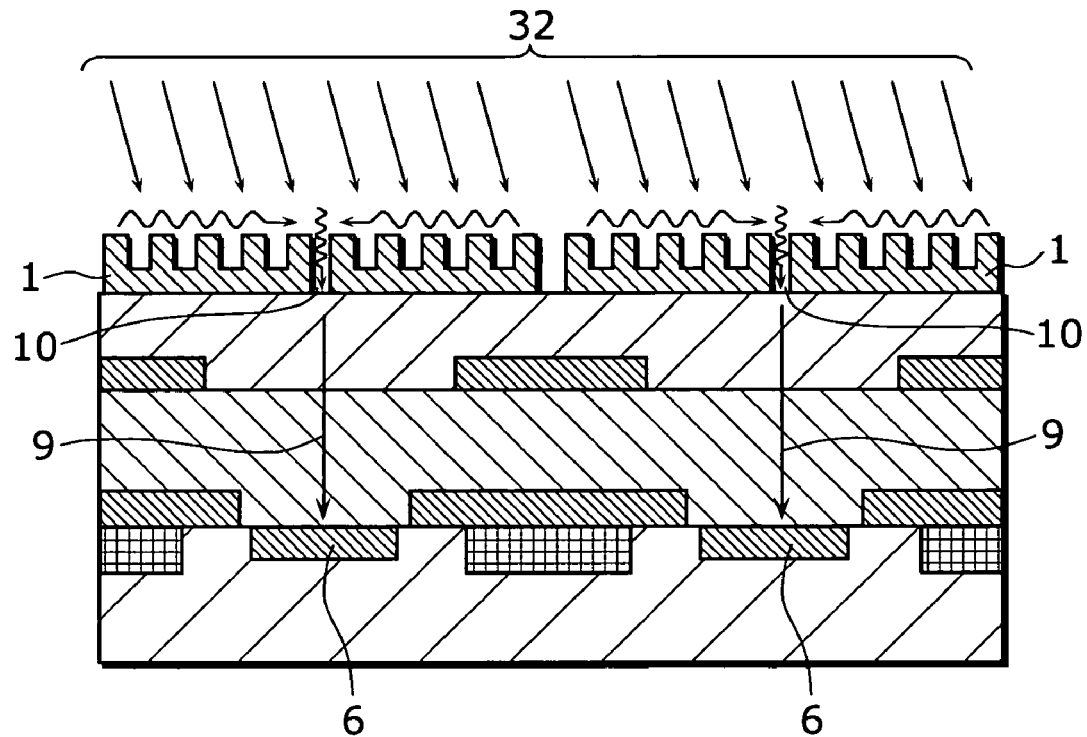
FIG. 4 is a cross-sectional view of the solid-state imaging device of the first embodiment.

Also, as shown in FIG. 4, an optical element 1 can condense all the incident light by forming an optimum cyclical pitch p that enables condensing of the oblique incident light 32.

In this way, optical elements 1 can efficiently condense the light by forming an optimum cyclical pitch p depending on the angle of incident light and the color for each pixel.

Figure 5:
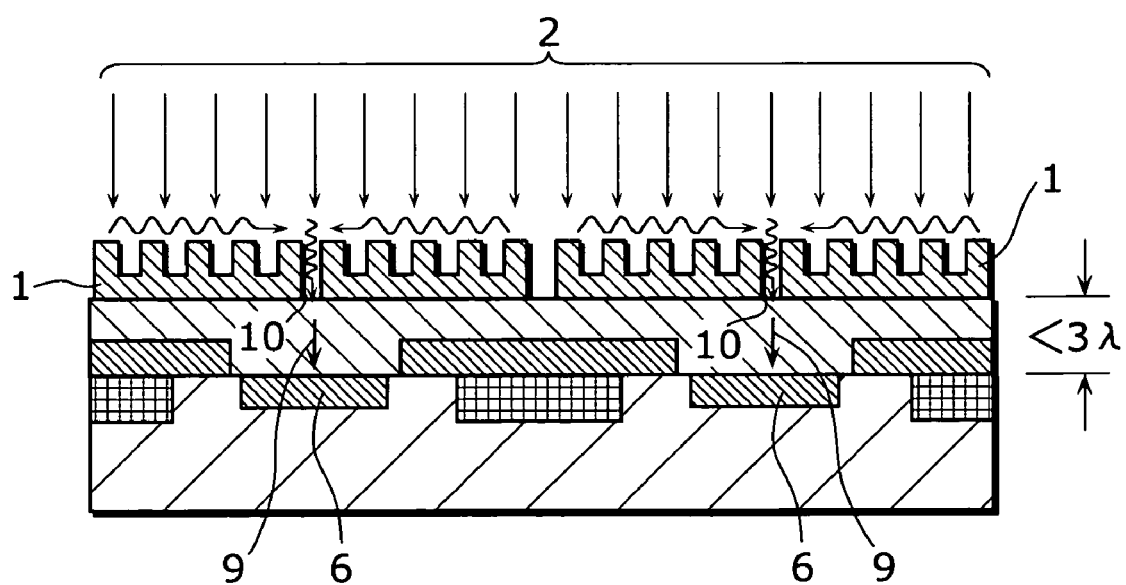
FIG. 5 is a cross-sectional view of the solid-state imaging device of the first embodiment.

Further, as shown in FIG. 5, taking into consideration the diffusion of the irradiation light 9, it is preferable that the distance from the base surface of an optical element 1 to the top surface of a light receiving element 6 is not more than 3 wavelengths of the light to be condensed in order to guide the irradiation light 9 from the aperture 10 towards the light receiving elements 6.

Also, even in the case where a light receiving element 6 is displaced from the center of a pixel as shown in FIG. 6, it is possible to efficiently condense incident light to the light receiving element 6 by forming the aperture 10 of the optical element 1 perpendicularly above the light receiving element 6 as shown in the cross-sectional views of FIG. 6 and FIG. 7A and the top view of FIG. 7B.

Note that the optical element 1 in the above-described embodiment 1 is square-shaped when seen from above as shown in FIG. 3. However, the optical element 1 may be rectangular-shaped, circular-shaped or triangular-shaped when viewed from above. In other words, the shapes of the optical element 1 when viewed from above are not limited.

Figure 8A:
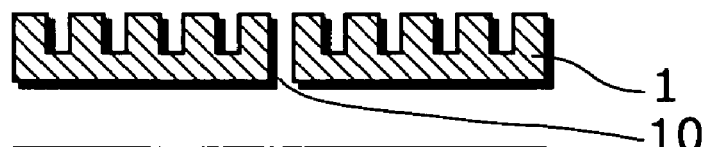
FIG. 8A is a cross-sectional view of the optical element 1 of the first embodiment.
Figure 8B:
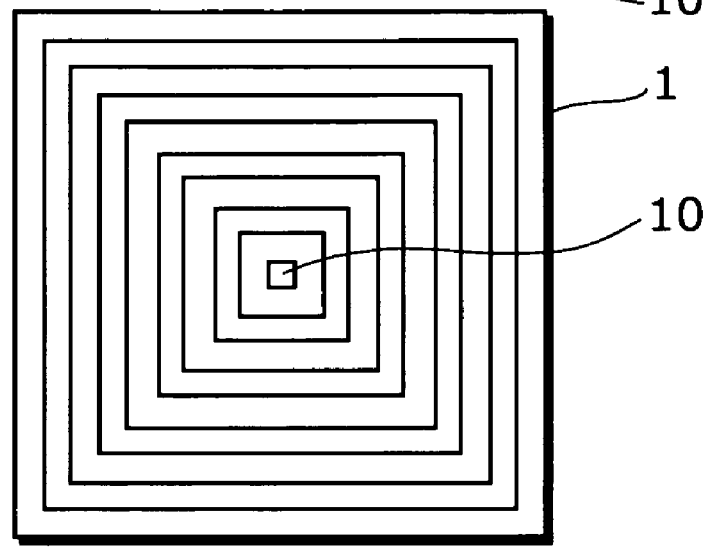
FIG. 8B is a top view of the optical element 1 of the first embodiment.

Also, the pattern of the optical element 1 may be the following pattern as shown in FIG. 8: the pattern including convex parts (a) each of which is formed on each whole of concentric squares which have an aperture 10 as a center and respectively have a predetermined width, and (b) which are arranged so that the side walls of the convex parts in the same directions are parallel to each other. FIG. 8A is a cross-sectional view of the optical element 1 according to this embodiment, and FIG. 8B is a top view of the optical element 1 according to this embodiment. The widths of the respective convex parts must be the same as the gaps between adjacent convex parts which are parallel, and the widths and the gaps each must be not more than 1 wavelength of the light to be condensed.

Figure 9A:
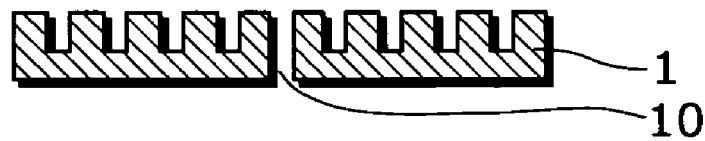
FIG. 9A is a cross-sectional view of the optical element 1 of the first embodiment.
Figure 9B:
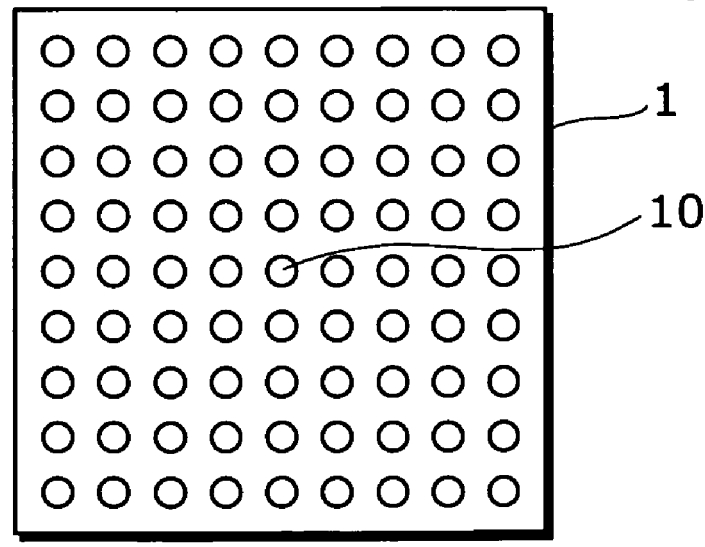
FIG. 9B is a top view of the optical element 1 of the first embodiment.

Also, the pattern of optical element 1 may be the structure pattern where cylinders are periodically arranged at predetermined intervals as shown in FIG. 9. FIG. 9A is a cross-sectional view of the optical element 1 according to this embodiment, and FIG. 9B is a top view of the optical element 1 according to this embodiment. The diameter of each convex part is the same as the gap between adjacent convex parts, and the widths of the diameter and the gap must be not more than 1 wavelength of the light to be condensed.

Second Embodiment

Next, the solid-state imaging device of a second embodiment will be described below.

Figure 10:
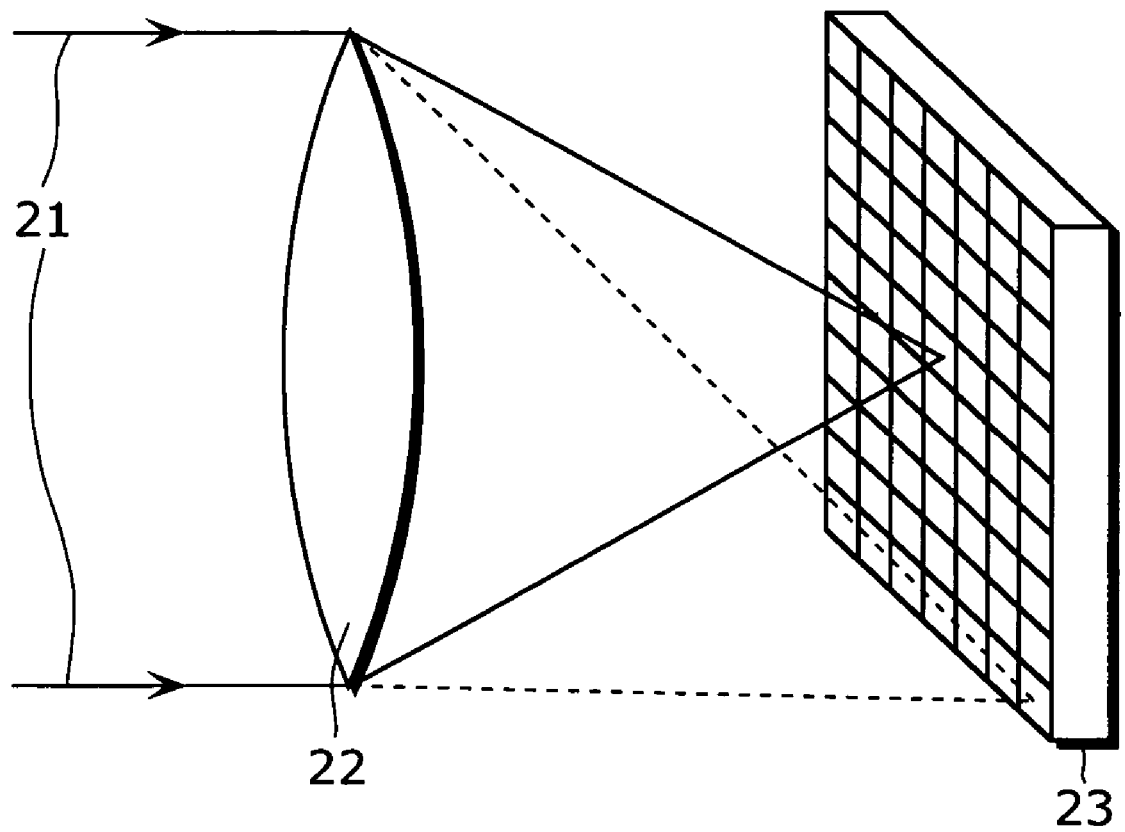
FIG. 10 is a diagram showing the arrangement of pixels in a solid-state imaging device and others in a second embodiment.

FIG. 10 is a diagram showing how pixels are arranged in the solid-state imaging device 23 of the second embodiment. A signal light 21 is condensed by an optical lens 22 and then focused on the solid-state imaging device 23 having optical elements 1. In the solid-state imaging device 23, the following are arranged in a two-dimensional array: semiconductor integrated circuits including a light receiving element and wires; and an optical element 1. There is a difference in incident angle between the center part and the peripheral part. The angle of incident light into a pixel in the center part is substantially 0 degrees. The angle of incident light into a pixel in the peripheral part is about 30 to 40 degrees.

Figure 11:
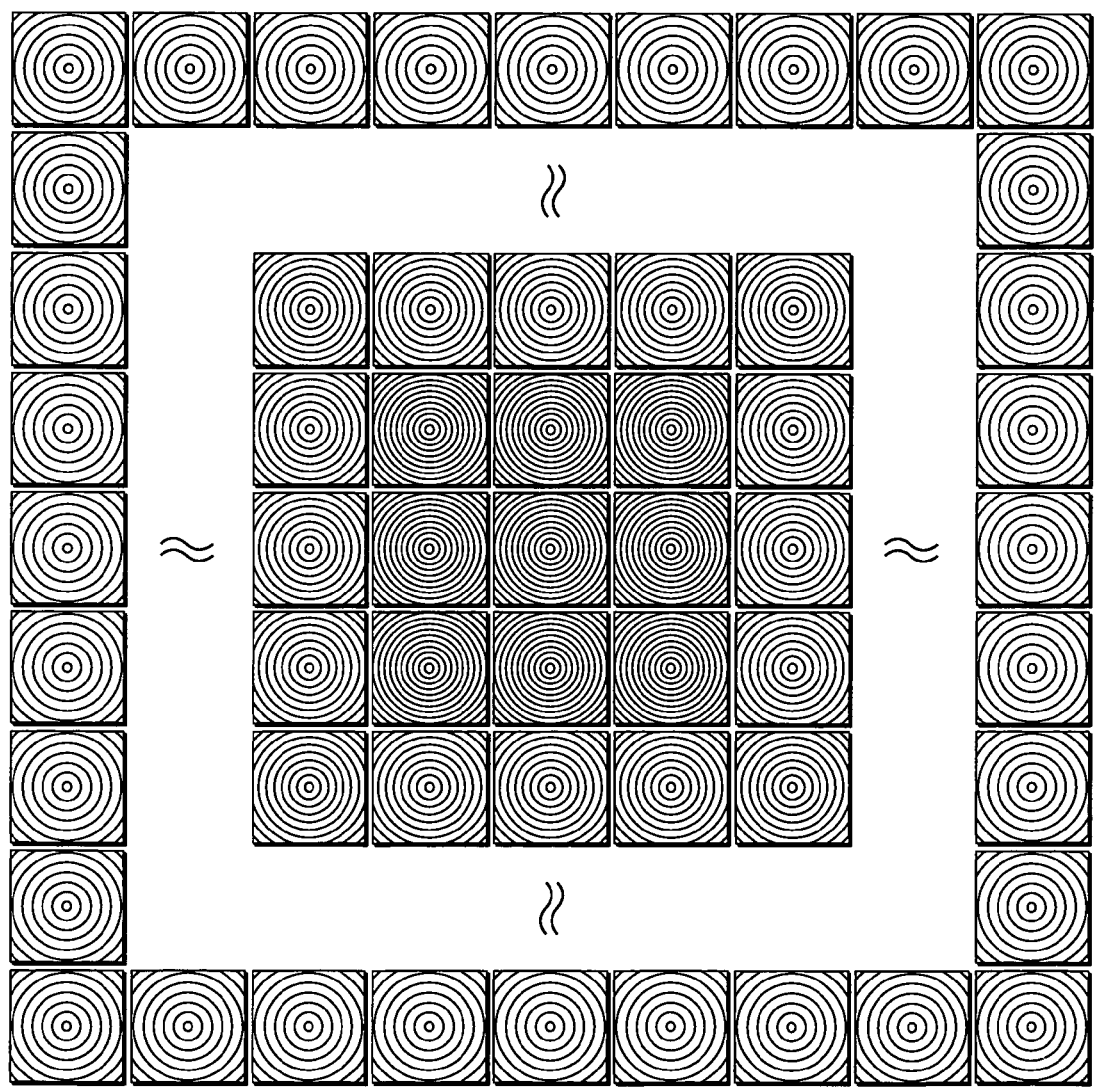
FIG. 11 is a diagram showing how pixels are arranged in the solid-state imaging device of the second embodiment.

To efficiently condense incident light, optical elements 1 for each pixel have a different cyclical pitch and a different pattern shape, respectively. For example, as shown in FIG. 11, the cyclical pitch of the optical element 1 of the pixels in the peripheral part is made longer than those of the pixels in the center part. In this way, light can be condensed at a high efficiency even in the case where the angle of incident light is different.

Such a designed pattern will be described below. First, it is defined that the wave number of light is k, the x component of the wave number is kx, and the y component of the wave number is ky. When the cycle of the cyclical pitch is T and q=2$\pi$/T, it is defined that the x direction of "q" is qx=2$\pi$/Tx, and the y direction of "q" is qy=2$\pi$/Ty. When |m| is an integer that is not less than 2, the pattern is designed so that kx+mqx and ky+mqy match the energy of plasmons.

Figure 12:
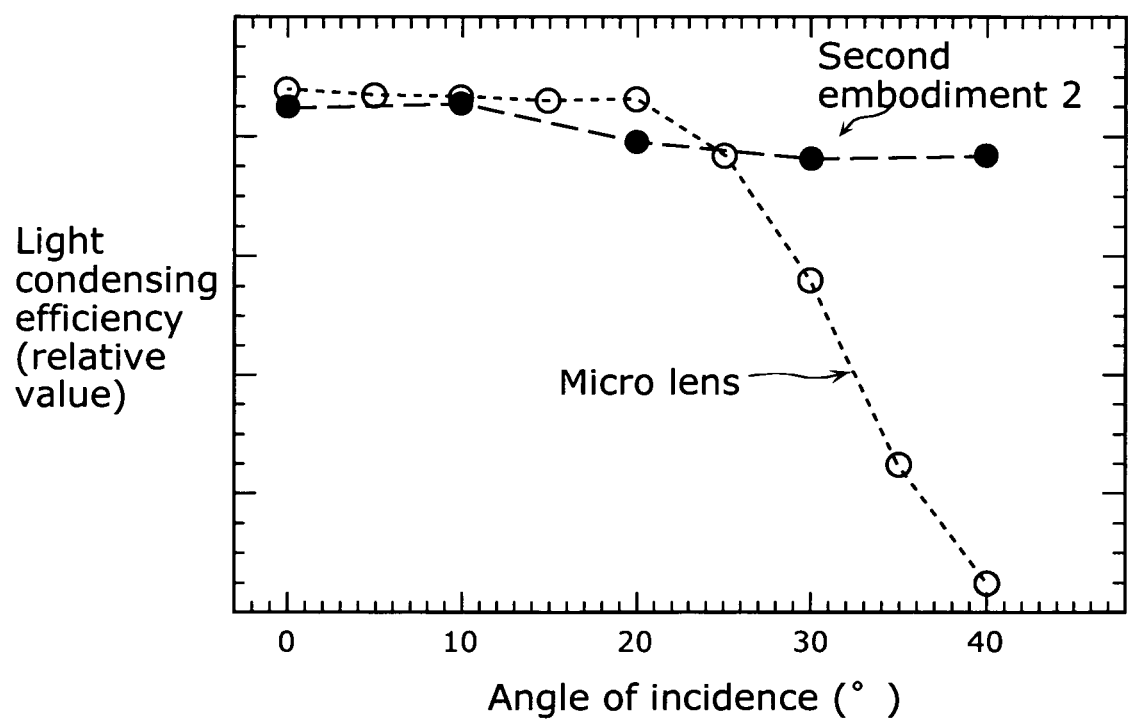
FIG. 12 is a diagram showing the relationship between the angle of light incidence and the light condensing efficiency in the solid-state imaging device of the second embodiment.

Here, FIG. 12 shows the relationship between the angle of incident light and the light condensing efficiency. FIG. 12 shows characteristics of the light condensing efficiency of the solid-state imaging device 23. The horizontal axis shows the angle of incident light to the solid-state imaging device 23. Here, 0 degrees represents the incident angle to the pixels in the center part and 30 degrees and more represent the incident angle to the pixels in the peripheral part.

As shown in FIG. 12, in the case of a conventional solid-state imaging device having a microlens, its light condensing efficiency decreases dramatically when the angle of incidence becomes wider exceeding 20 degrees. In contrast, in the case of the solid-state imaging device 23 of the second embodiment, its light condensing efficiency does not decrease much, even when the angle of incidence exceeds 20 degrees. In other words, in the case of the solid-state imaging device 23 of the second embodiment, even the pixels in the peripheral part can have a high light condensing efficiency. As shown in FIG. 12, irrespective of the angle of incidence, the optical element 1 can condense light at a high efficiency compared to microlenses. For this reason, the solid-state imaging device 23 having optical elements 1 can be used for an apparatus having a short-focus optical system, for example, a camera for a mobile phone.

Further, it is desirable that gaps between adjacent optical elements 1 be small as possible, because gaps are a cause of loss of incident light. However, respective optical elements 1 must be electrically isolated from each other. For example, the respective optical elements 1 are electrically isolated from each other. The gaps of adjacent optical elements 1 are made longer than the difference t in radius and the diameter of the aperture d. In addition, it is desirable that an optical element 1 be formed on an insulating layer. Satisfying these conditions makes it possible to prevent mixture of colors and crosstalk.

An example case of forming an optical element 1 is shown in FIG. 11 and will be described below. This embodiment is square-shaped when viewed from above. Gaps between adjacent pixels are set at the above-mentioned distance that enables the respective pixels to be electrically isolated from each other, and then the respective pixels are two-dimensionally arranged over the whole pixel area. In this way, it is possible to prevent mixture of colors and crosstalk. Also, it is possible to reduce the amount of leakage light and loss of incident light.

Third Embodiment

Next, a manufacturing method of an optical element 1 will be described below with reference to FIG. 13.

Figure 13A:
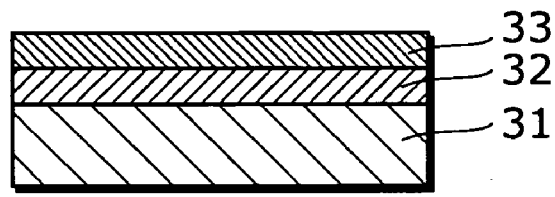
FIGS. 13A to 13E each is a diagram showing a manufacturing process of an optical element of a third embodiment.

First, in the semiconductor manufacturing process, a solid-state imaging element substrate 31 is formed by arranging, on a Si substrate, the following: light receiving elements; a wire; a light blocking layer; and a signal transmission unit. A pixel is a cube measuring 2.8 μm per side, and a light receiving element is a cube measuring 1.1 μm. After that, as shown in FIG. 13A, a metal film 32 having a thickness of 0.5 μm or the like is formed on the solid-state imaging element substrate 31 by means of the evaporation method or the sputtering method, and then a resist 33 having a thickness of 0.5 μm or the like is formed on the metal film 32.

Figure 13B:
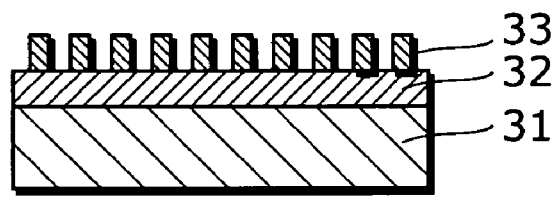
Figure 13C:
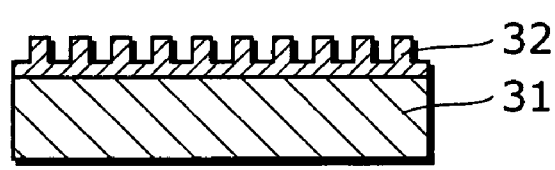

Next, as shown in FIG. 13B, the form of the resist 33 is changed into a pattern of a concentric circle structure or the like by means of photolithography. After that, as shown in FIG. 13C, the form of a metal film 32 is changed into a pattern of a concentric circle structure or the like by means of wet etching or dry etching.

Figure 13D:
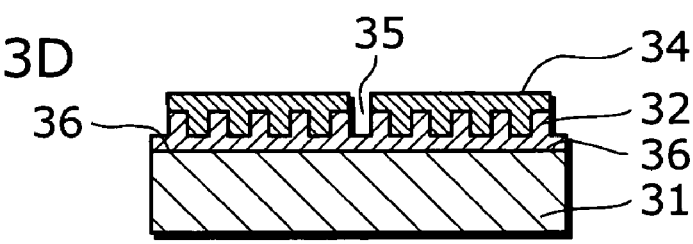

Further, as shown in FIG. 13D, a resist 34 is formed on the pattern of metal film 32 in order to form an aperture 35 and a pixel separation portion 36 for electrically isolating adjacent pixels from each other. After that, the resist 34 is removed from the part where the aperture 35 and the pixel separation portion 36 are to be formed by means of photolithography.

Figure 13E:
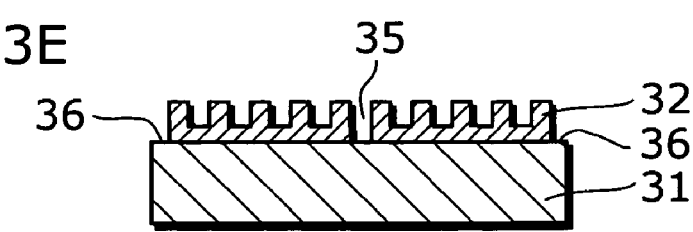

After that, etching of a metal film 32 on which the resist 34 is not formed is performed so as to form the aperture 35 and the pixel separation portion 36. Wet etching or dry etching may be used in performing etching of the metal film 32. After that, as shown in FIG. 13E, the resist 34 is removed. In this way, an optical element 1 is completed.

Fourth Embodiment

Next, a manufacturing method of an optical element 1 that is different from the manufacturing method of a third embodiment will be described with reference to FIG. 14.

Figure 14A:
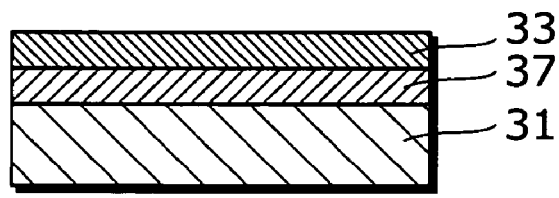
FIGS. 14A to 14F each is a diagram showing a manufacturing process of an optical element of a fourth embodiment.

First, in the semiconductor manufacturing process, a solid-state imaging element substrate 31 is formed by arranging, on a Si substrate, the following: light receiving elements; a wire; a light blocking layer; and a signal transmission unit. A pixel is a cube measuring 2.8 μm per side, and a light receiving element is a cube measuring 1.1 μm. After that, as shown in FIG. 14A, a $SiO_2$ film 37 having a thickness of 0.5 μm or the like is formed on the solid-state imaging element substrate 31 by means of the plasma CVD method, and then a resist 33 having a thickness of 0.5 μm or the like is formed on the $SiO_2$ film 37.

Figure 14B:
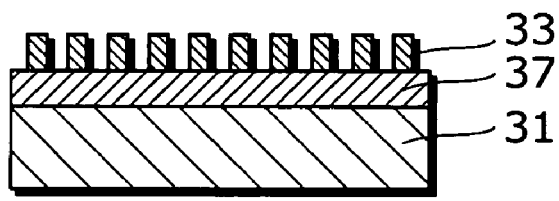
Figure 14C:
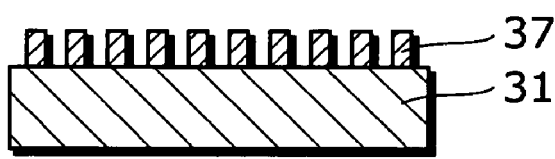
Figure 14D:
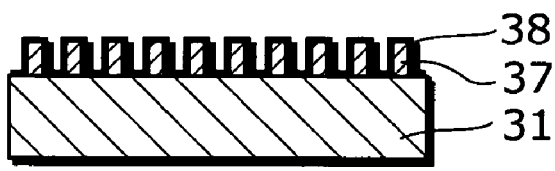

Next, as shown in FIG. 14B, the form of the resist 33 is changed into a pattern of a concentric circle structure having convex parts and concave parts or the like by means of photolithography. After that, as shown in FIG. 14C, the form of a $SiO_2$ film 37 is changed into a pattern of a concentric circle structure having convex parts and concave parts or the like by means of dry etching. After that, as shown in FIG. 14D, a metal film 38 is formed on the solid-state imaging element substrate 31 and the $SiO_2$ film 37 by means of the evaporation method and the sputtering method.

Figure 14E:
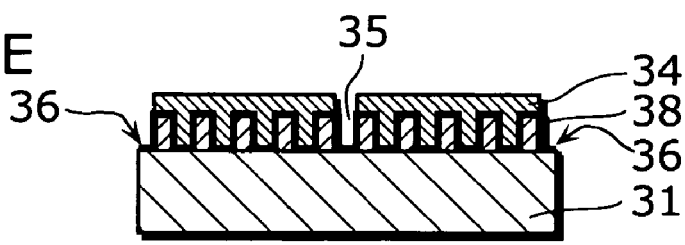
Figure 14F:
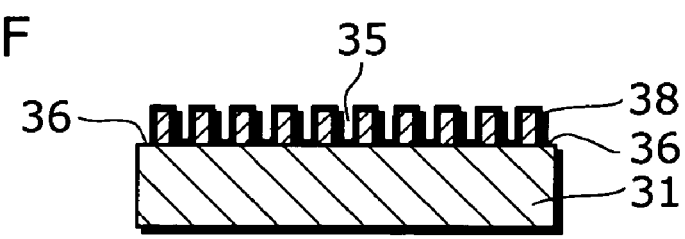

Further, as shown in FIG. 14E, a resist 34 is formed on the metal film 38 in order to form a pixel separation portion 36 for electrically isolating adjacent pixels from each other. Next, the resist 34 is removed from the part where the aperture 35 and the pixel separation portion 36 are to be formed by means of photolithography. After that, as shown in FIG. 14F, the metal film 38 and the resist 34 are removed by etching from the part where the aperture 35 and the pixel separation portion 36 are to be formed. In this case, wet etching or dry etching may be used. In this way, an optical element 1 is completed.

INDUSTRIAL APPLICABILITY

A solid-state imaging device of the present invention is useful for digital video cameras, digital still cameras, mobile phones with a camera or the like, and can improve the performance and reduce the prices of such apparatuses.

What is claimed is:
1. A solid-state imaging device comprising:
pixels arranged in a two-dimensional array, each of said pixels including a light receiving element and an optical element formed closer to a light receiving side of each of said pixels than said light receiving element, said optical element of each of said pixels having a surface made of metal, an aperture, convex parts arranged cyclically, a cyclical pitch between each pair of adjacent convex parts, and a pattern of said convex parts,
wherein the cyclical pitch and the pattern of said convex parts for said optical element of each of said pixels is different from the cyclical pitch and the pattern of said convex parts for said optical element of each other of said pixels, and the cyclical pitch between each pair of adjacent convex parts in said optical element and a width of each convex part in said optical element is greater than 0 and equal to or less than 1 wavelength of light to be condensed, and wherein a first pixel of said pixels is disposed in a peripheral part of the two-dimensional array and a second pixel of said pixels is disposed in a center part of the two-dimensional array, and the cyclical pitch of said optical element of said first pixel is greater than the cyclical pitch of said optical element of said second pixel.

2. The solid-state imaging device according to claim 1, wherein said convex parts for said optical element of each of said pixels are arranged in concentric circles.

3. The solid-state imaging device according to claim 2, wherein said convex parts consist of pillar-shaped convexes.

4. The solid-state imaging device according to claim 1, wherein said convex parts for said optical element of each of said pixels are arranged in concentric polygons.

5. The solid-state imaging device according to claim 4, wherein said convex parts consist of pillar-shaped convexes.

6. The solid-state imaging device according to claim 1, wherein a distance between each pair of adjacent convex parts and the width of each convex part correspond to a color of light to be condensed.

7. The solid-state imaging device according to claim 1, wherein a distance between each pair of adjacent convex parts and the width of each convex part correspond to an angle of incident light to be condensed.

8. The solid-state imaging device according to claim 1, wherein a distance between a top surface of said light receiving element and a base surface of said optical element is not more than 3 wavelengths of light to be condensed.

9. The solid-state imaging device according to claim 1, wherein a height of each convex part ranges from 0 to not more than 1 wavelength of light to be condensed.

10. The solid-state imaging device according to claim 1, wherein adjacent optical elements are electrically isolated from each other.

11. The solid-state imaging device according to claim 1, wherein said optical element and said light receiving element of each of said pixels is displaced from a center of said each of said pixels.

12. The solid-state imaging device according to claim 1, wherein a distance between adjacent optical elements is greater than a diameter of said aperture.

13. The solid-state imaging device according to claim 1, wherein a diameter of said aperture is equal to a distance between adjacent convex parts.

* * * * *